US012663564B2

US 12,663,564 B2

(12) United States Patent
Shen et al.

(10) Patent No.: US 12,663,564 B2
(45) Date of Patent: Jun. 23, 2026

(54) OPTIMIZED OPTICAL ELEMENT FOR LED

(71) Applicant: Lumileds LLC, San Jose, CA (US)

(72) Inventors: Yu-Chen Shen, Sunnyvale, CA (US);
Bahareh Ramezan Pour, Benicia, CA
(US)

(73) Assignee: Lumileds LLC, San Jose, CA (US)

( * ) Notice: Subject to any disclaimer, the term of this
patent is extended or adjusted under 35
U.S.C. 154(b) by 0 days.

(21) Appl. No.: 18/942,994

(22) Filed: Nov. 11, 2024

(65) Prior Publication Data

US 2026/0133350 A1 May 14, 2026

(51) Int. Cl.
| | |
|---|---|
| *G02B 3/02* | (2006.01) |
| *F21K 9/69* | (2016.01) |
| *F21Y 101/00* | (2016.01) |
| *F21Y 105/16* | (2016.01) |
| *F21Y 115/10* | (2016.01) |
| *G02B 3/00* | (2006.01) |
| *H10H 20/825* | (2025.01) |
| *H10H 20/855* | (2025.01) |
| *H10W 90/00* | (2026.01) |

(52) U.S. Cl.
CPC .................. *G02B 3/02* (2013.01); *F21K 9/69*
(2016.08); *H10H 20/855* (2025.01); *H10W
90/00* (2026.01); *F21Y 2101/00* (2013.01);
*F21Y 2105/16* (2016.08); *F21Y 2115/10*
(2016.08); *G02B 2003/0093* (2013.01); *H10H
20/825* (2025.01)

(58) Field of Classification Search
CPC ....... F21K 9/69; F21K 19/69; H01L 25/0753;
F21Y 2115/10; F21Y 115/10; F21Y
2101/00; F21Y 2105/16; H10H 20/825;
H10H 20/855; G02B 19/0061; G02B
19/0009; G02B 19/0014; G02B 3/0093;
G02B 3/04; G02B 3/004; G02B 3/02;
G02B 2003/0093; H10W 90/00
See application file for complete search history.

(56) References Cited

U.S. PATENT DOCUMENTS

| | | | | |
|---|---|---|---|---|
| 11,069,838 | B2 * | 7/2021 | Murata | .............. H10H 20/8506 |
| 2013/0299860 | A1 * | 11/2013 | Mineshita | .......... H10H 20/8506 |
| | | | | 257/98 |
| 2015/0023016 | A1 * | 1/2015 | Ishihara | ............... H10H 20/831 |
| | | | | 362/267 |
| 2016/0293813 | A1 * | 10/2016 | Aruga | ................... H10H 20/855 |
| 2018/0315908 | A1 * | 11/2018 | Lee | ...................... H10H 20/851 |
| 2020/0135992 | A1 * | 4/2020 | Kikuchi | ............. H10H 20/8506 |
| 2021/0180755 | A1 * | 6/2021 | Park | ..................... H10H 20/855 |

* cited by examiner

*Primary Examiner* — Erin Kryukova

(57) ABSTRACT

A lens comprises a base and a head where the base may have
one or more side walls with a straight cross-section and the
head may have one or more surfaces with a curved cross-
section forming an apex at the top of the lens with an
effective radius of curvature. The base thickness, the total
thickness of the lens, and/or the effective radius of curvature
may be tuned to improve emission directionality and/or light
extraction efficiency of an LED over which the lens is
disposed. Individual ones of the lens may be disposed over
individual LEDs in an array. To reduce crosstalk.

17 Claims, 14 Drawing Sheets

400

300

320

130

120

110

310

300

OPTIMIZED OPTICAL ELEMENT FOR LED

FIELD OF THE INVENTION

The invention relates generally to optical elements, specifically individual lens for LED light sources.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths. LEDs may be combined with one or more wavelength converting materials (generally referred to herein as "phosphors") that absorb light emitted by the LED and in response emit light of a longer wavelength.

Inorganic LEDs and phosphor converted LEDs may be used to create different types of displays including, for example, augmented-reality (AR) displays, virtual-reality (VR) displays, and mixed-reality (MR) displays.

There is a growing demand for advanced lighting solutions, such as obtaining the highest luminance color LED. Many applications use large clusters under a common optic. These advanced light sources find crucial applications in various industries, including entertainment lighting for theaters and concerts, film sets, and high-power façade/architectural illumination. The common objective across these diverse applications is to extract the maximum light output from a given Light Emitting Surface (LES) area.

However, clusters of LED under a common optic may experience certain issues, such as crosstalk between LEDs of different colors and/or limited efficiency of power output in certain directions. There is a demand and need for lighting solutions that fix these issues.

SUMMARY

There has also been growing demand for the development of individual lenses for each LED in the system to optimize system efficiency. Such individual lenses have advantages over using a common optic.

Embodiments of an invention include a lens designed to be disposed over an LED which may be used in an array. The lens may serve to precisely direct light from an LED in the target direction and desired radiation profile, thereby increasing power within the targeted cone angle. Simultaneously, the lens may minimize or help minimize crosstalk between multiple LEDs within a system. This is achieved by tuning the characteristics of the lens, such as a thickness of a base of the lens, a total thickness of the lens, and/or an effective radius of curvature of the lens' apex. Embodiments of the invention ensure optimal power output and efficiency, providing solutions for diverse lighting needs.

These and other embodiments, features and advantages of the present invention will become more apparent to those skilled in the art when taken with reference to the following more detailed description of the invention in conjunction with the accompanying drawings that are first briefly described.

DETAILED DESCRIPTION

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
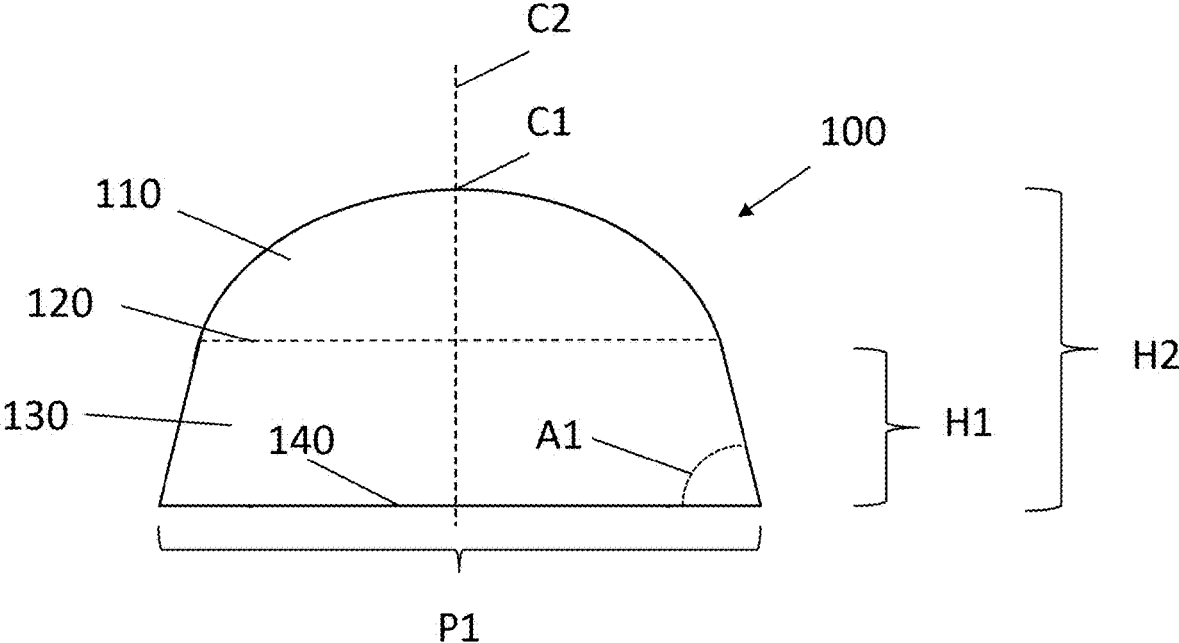
FIG. 1 schematically illustrates a cross-sectional view of a lens with a base and a head and a central axis through the apex.

As summarized above, this specification discloses optical elements and/or LED light sources. FIG. 1 depicts a lens 100 according to embodiments of the invention. The lens 100 may be described in terms of a base 130 and a head 110 sitting on top of the base 130 divided from the base 130 by an imaginary line 120. The base 130 may be integral and/or monolithic with the head 110 such that they are formed to be a single piece. For example, the base 130 and the head 110 may be seamlessly connected to each other at the imaginary line 120 with a smooth, continuous surface, and/or may be formed of the same material as each other, such as silicone (e.g., silicone with refractive index from 1.2-1.8, such as 1.55). Alternatively, the base 130 and the head 110 may be of different materials, and/or may be glued to each other along the imaginary line 120. The base 130 and the head 110 may each be hollow or completely filled.

The base 130 may have a flat surface 140 opposite from the apex of the lens 100. One or more side walls may extend from the flat surface 140 at an angle A1 with a range of 45-90 degrees, such as from 60-85 degrees. The side walls may extend from the flat surface 140 to the imaginary line 120, i.e., an entire vertical base thickness H1 of the base 130.

Figure 4:
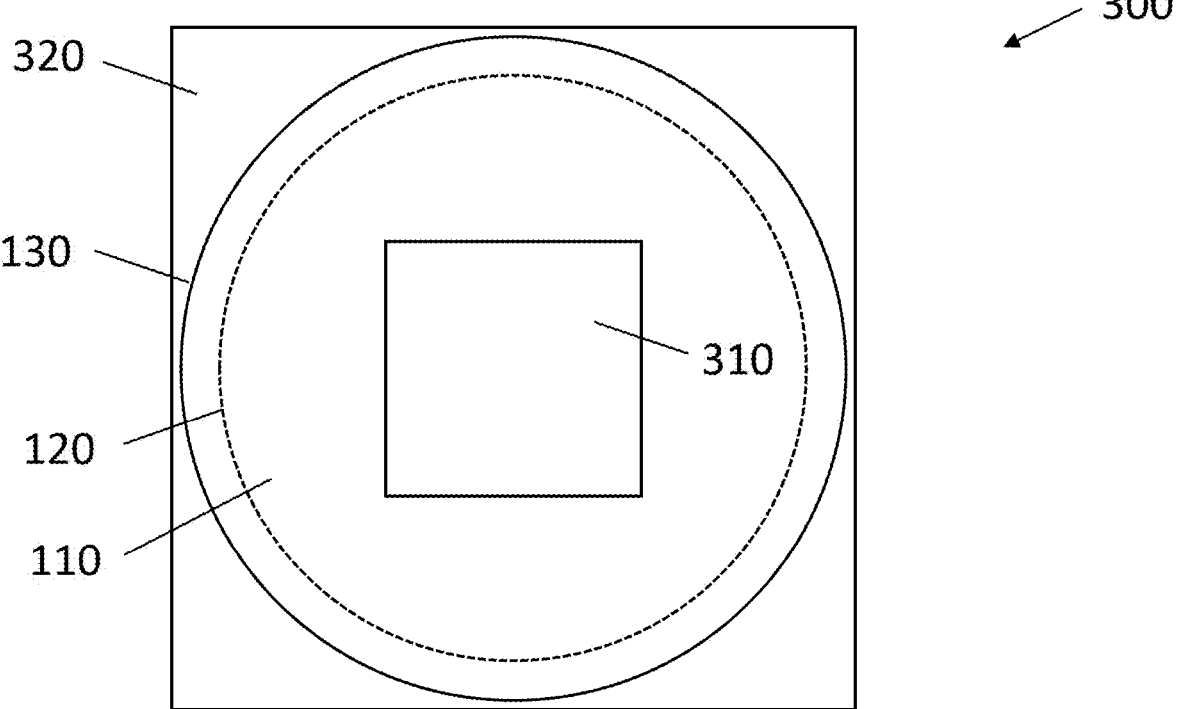
FIG. 4 schematically illustrates plan view of a lens over an LED on a substrate.

The imaginary line 120 may mark the distal end of the base 130 distal from the flat surface 140. The imaginary line 120 may also mark the lowest end of the head 110. The side walls may form straight lines when looking down a direction parallel to the flat surface 140, such as shown in FIG. 1. The one or more side walls may be a single continuous side wall extending around and from the perimeter of the flat surface 140. In this example, the single continuous side wall may form the sides of a cone with the apex and a region nearest the apex truncated, i.e. a single curved surface. The one or more side walls may form an outer shape and an inner shape within the outer shape when viewed in a direction perpendicular to the flat surface 140, such as shown in FIG. 4. In FIG. 4 the outer shape is a circle and the inner shape (denoted by imaginary line 120) is a circle. However, the outer shape and the inner shape may each be any shape, such as oval or an n-sided polygon such as rectangle, square, hexagon, and the like, and could furthermore be an n-sided polygon where each side protrudes to form a symmetric curve that may or may not extend to the vertex of the polygonal side. The outer shape and the inner shape need not be the same shape. Another name for the outer shape is the outer perimeter of the base 130, while the inner shape may be referred to as the inner perimeter of the base 130 (and of the lens 100). The base 130 may have a solid or mostly solid volume filled with the same material as the one or more side walls, or it may be hollow such that the majority of the volume enclosed by the one or more side walls is air, vacuum, or any solid or gaseous material(s) different from that of the one or more side walls.

The head 110 may be a dome or dome-like with one or more surfaces extending from the distal ends of the base 130 to form an apex C1. For example, the head 110 may be a single curved surface extending from the inner perimeter of the base 130 to form an apex C1. A central axis C2 may extend through the apex C1 and/or through a center of the flat surface 140. The central axis C2 may be perpendicular to the flat surface 140. In a three-dimensional description the head 110 may be a portion of a spherical or roughly spherical body (e.g., hemispherical), a portion of a roughly non-spherical curved body, or a combination of the two. That is, the one or more surfaces may be curved when looking down a direction parallel to the flat surface 140, such as shown in FIG. 1. The apex C1 and a region immediately surrounding the apex C1 may be semicircular or otherwise an arc of a circle, i.e., having a circular curvature. The side walls extending away from this topmost region and down to the imaginary line 120 may be curved, and may have a curvature which is greater or lesser than that of portion of a circle. Alternatively, these side walls forming an arc of a circle all the way from the apex to the imaginary line 120. The curved side walls of head 110 may meet the flat side walls of base 130 at the imaginary line 120.

Figure 2:
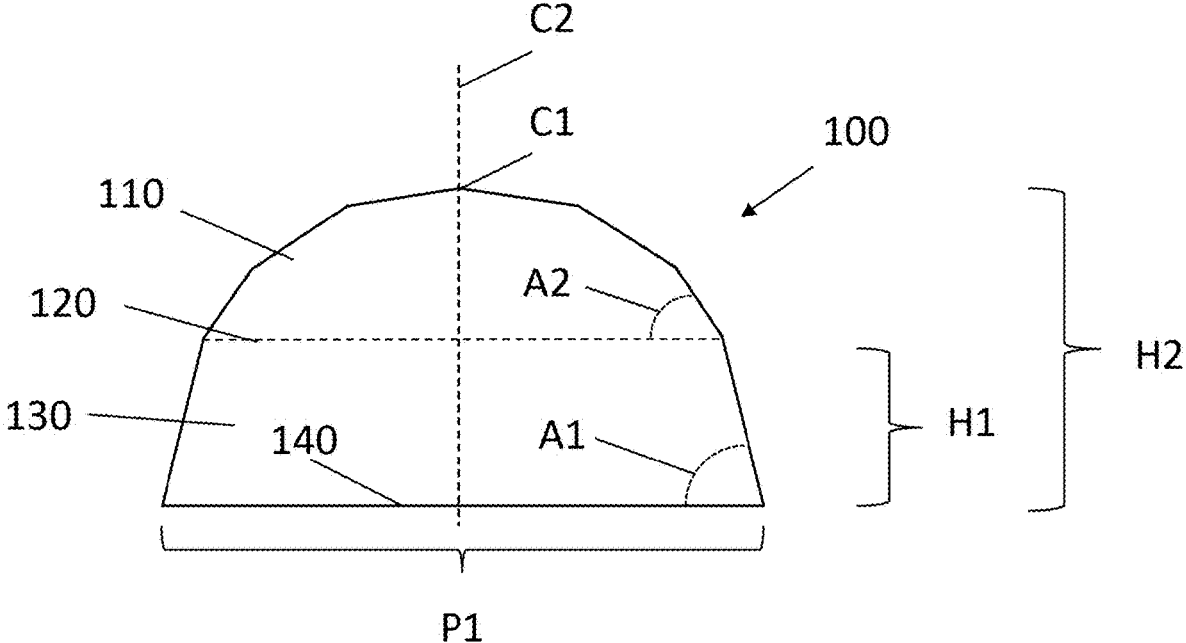
FIG. 2 schematically illustrates a cross-sectional view of a lens with a base and a faceted head and a central axis through the apex.

Alternatively, the head 110 may include more than one surface each of which is a facet of the head 110, as shown in FIG. 2. The facets extend successively from the top of the base 130 to form an apex C1. The facets extending directly from the base 130 may form an angle A2 with the imaginary line 120 that may be shallower than the angle A1, although this is not required and angle A2 may equal angle A1. The facets may each be flat surfaces, i.e., form a straight line when viewed in cross section, and forming vertices with each other. That is, the head 110 may be completely rectilinear when formed of the facets. The facets may have differing sizes and/or shapes as each other, or the same sizes and shapes as each other. Additionally, the facets may have a longest dimension which is the same quantity as each other, although this is not a requirement. Each or some of the facets may form non-parallel and/or non-perpendicular planes with each other, although this is not a requirement. Though the apex C1 and the immediate surrounding area formed by the facets may be rectilinear, it may have an effective radius of curvature corresponding to a region of a circle.

The head 110 may have a solid or mostly solid volume filled with the same materials as the one or more surfaces, or it may be hollow such that the majority of the volume enclosed by the one or more surfaces, and the imaginary line 120 is air, vacuum, or any solid or gaseous material(s) different from that of the one or more surfaces.

The head 110 and base 130 may form a lens 100 that can be applied for various purposes and applications based on the desired (and emitted) radiation profile, which may be non-Lambertian. Three different physical parameters—including base thickness H1, total thickness H2, and apex region curvature—in the dome design work together to achieve the best efficiency in the desired cone angle. The thicknesses (i.e., the vertical heights) may be measured in a vertical direction perpendicular to the flat surface 140. Several simulations have been performed to show the relationship between high efficiency and the geometrical properties of the lens 100, as shown in FIGS. 6-12. The simulations were conducted for a silicone filled lens all with the same RI of 1.55, with angle A1 at 85 degrees. For a ±65 degree flux gain greater than 25% over a conventional lens producing a Lambertian radiation pattern, a total thickness H2 of the lens 100 should be kept within the range of 900-1300 microns, such as from 1100-1200 microns, with a base thickness H1 of base 130 greater than 0 microns and equal to or less than 700 microns, such as from 100-400 microns. The total thickness H2 may be measured from the flat surface 140 (or a vertical height equivalent to that of the flat surface 140) to the apex C1. The base thickness H1 may be measured from the flat surface 140 to the imaginary line 120. The determination of the apex region curvature of base 130 is a more intricate process, as this parameter is contingent on both total and base thickness values. A closer look at the FIG. 9 reveals that when the apex region curvature exceeds 699 microns (um) within the specified total thickness range, the achieved efficiency surpasses 25% over a conventional lens producing a Lambertian radiation pattern. As a result, the curvature or effective curvature of the topmost region including the apex C1 may be in a range from 700 microns to 1100 microns, such as from 700-950 microns.

Figure 3:
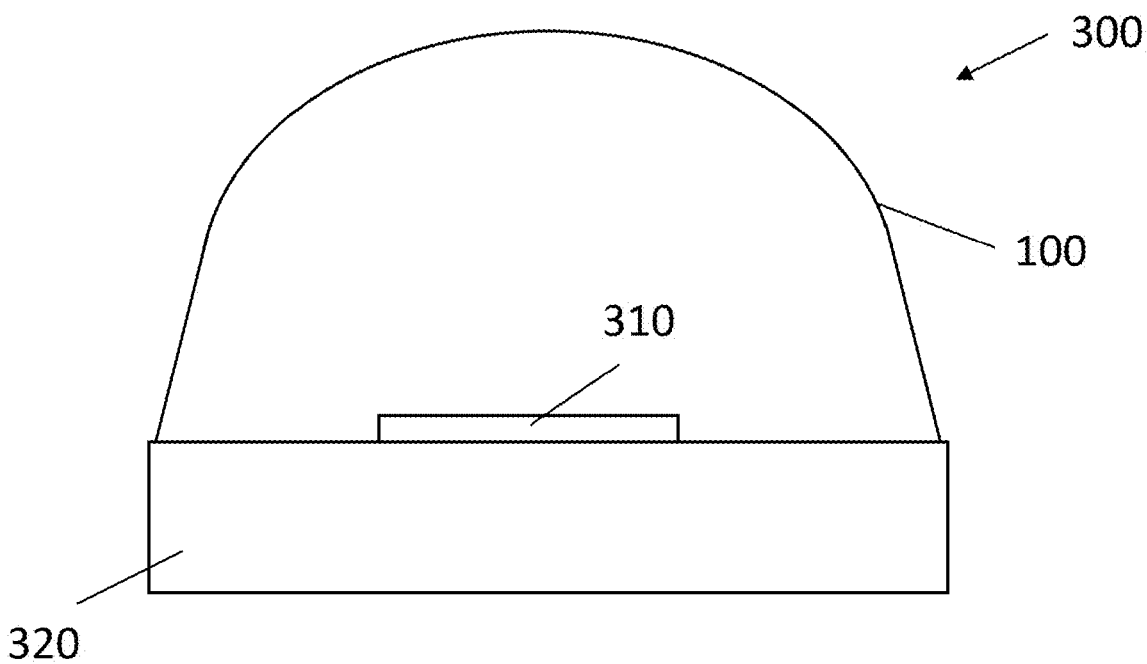
FIG. 3 schematically illustrates a cross-sectional view of a lens over an LED on a substrate.

FIG. 3 depicts the lens 100 installed in a light emitting device 300 with an LED 310. The lens 100 may be disposed with its flat surface 140 in direct contact with a substrate 320. The lens 100 may have a diameter or radius (of the outer perimeter, for example) bigger than a width of the LED 310. The base 130 may have a hollow which is the same size or substantially the same size of the LED 310, or larger than the LED 310, in which the LED 310 is disposed or embedded. The LED 310 may be in direct contact with the base 130 or it may not be. One or both of the outer perimeter and inner perimeter of the base 130 may be larger than a horizontal width of the LED 310, as shown in FIG. 3. The LED 310 may be, for example, blue InGaN thin film without a sapphire substrate with a thickness of 10 microns. The LED 310 may emit light of a first wavelength, such as a red, green, or blue light. The light emitted by the LED 310 have its trajectory altered by the lens 100, and may be emitted from the light emitting device 300 without having passed through or been re-emitted by any phosphorous material.

Figure 6:
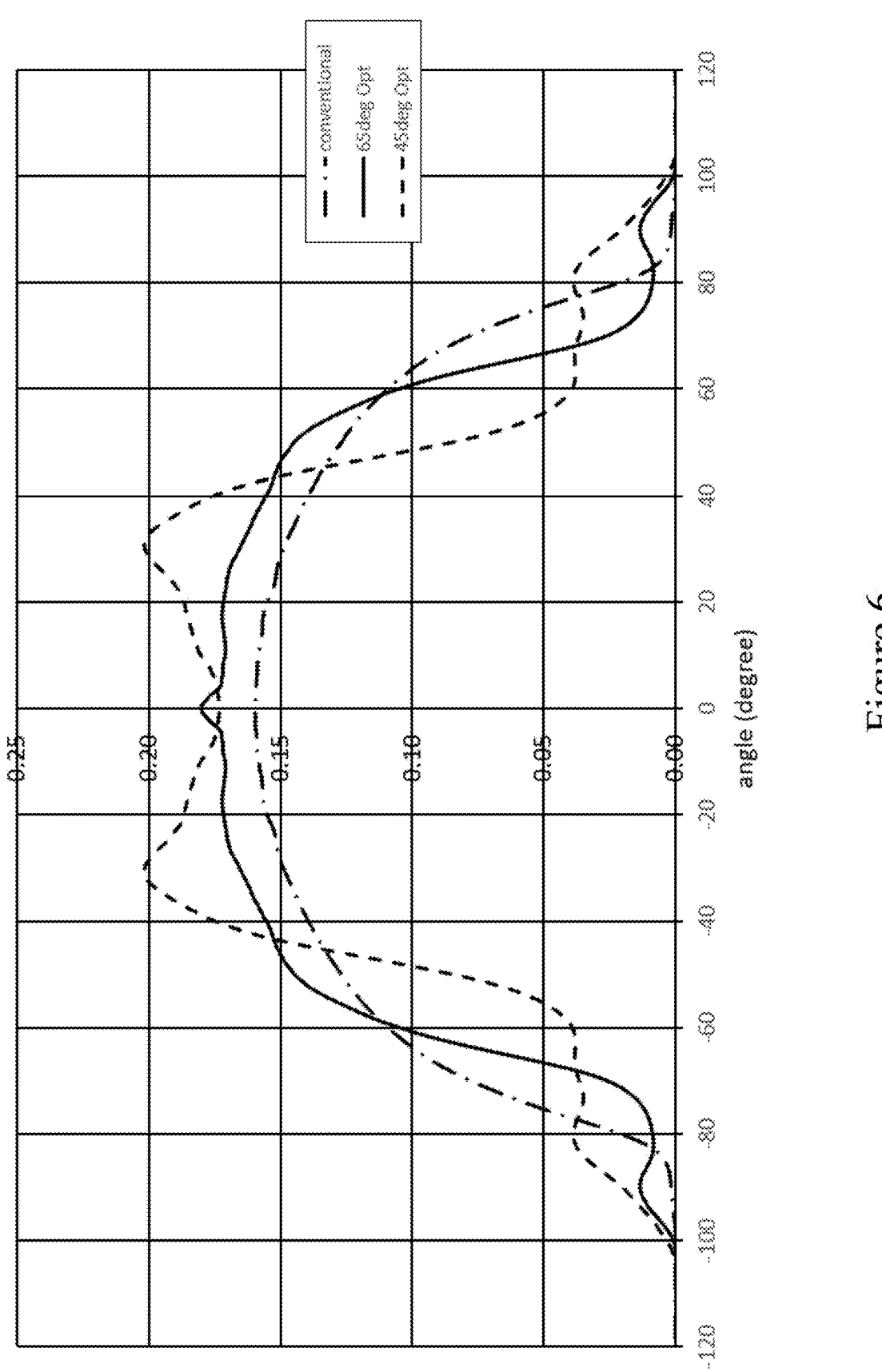
FIG. 6 shows radiation profiles of conventional lens compared with lens according to embodiments of the invention.
Figure 7:
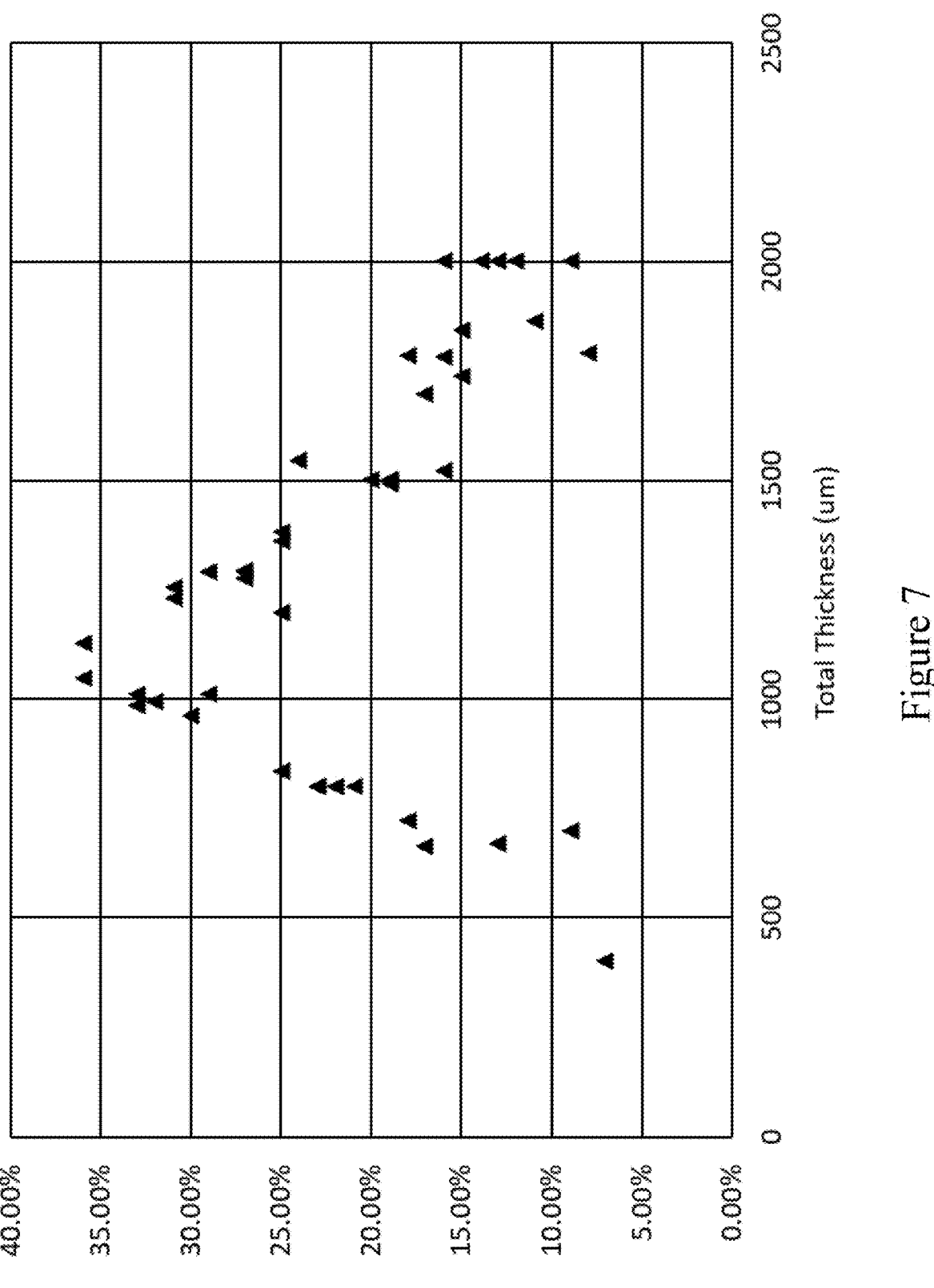
FIG. 7 shows flux gain in a 65 degree cone varying with total thickness of the lens.
Figure 8:
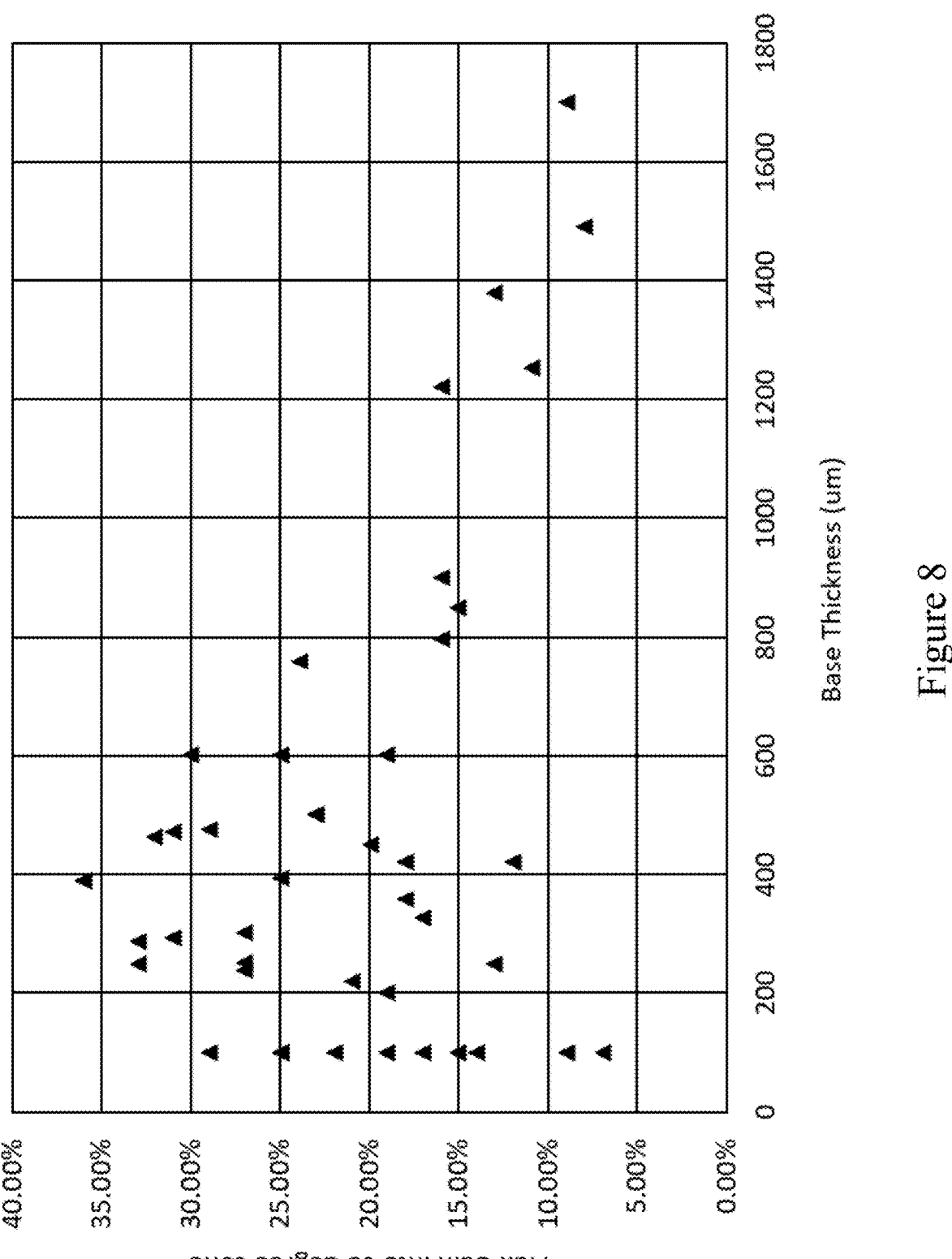
FIG. 8 shows flux gain in a 65 degree cone varying with base thickness of the lens' base.
Figure 9:
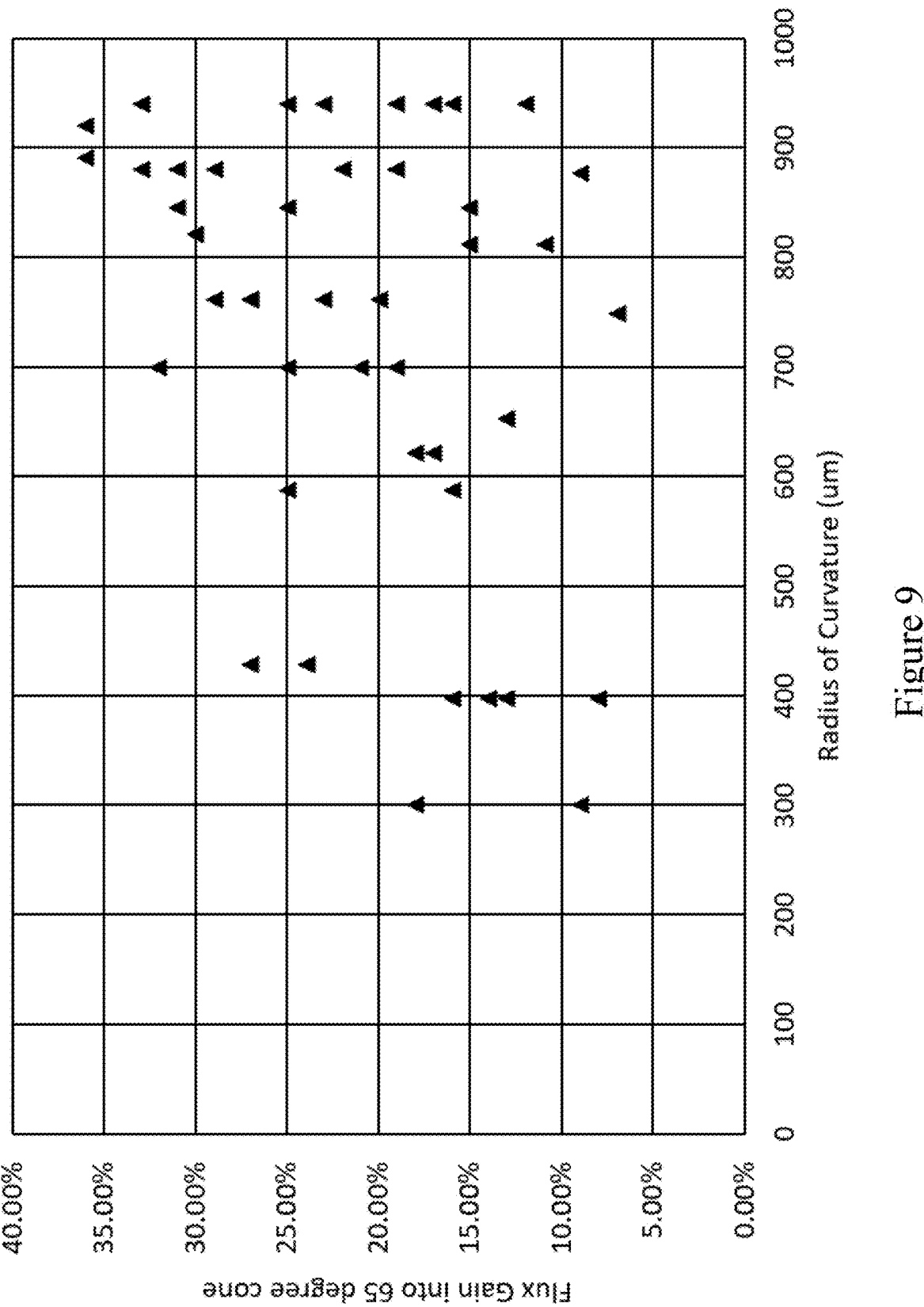
FIG. 9 shows flux gain in a 65 degree cone varying with radius of curvature of a lens' apex.
Figure 10:
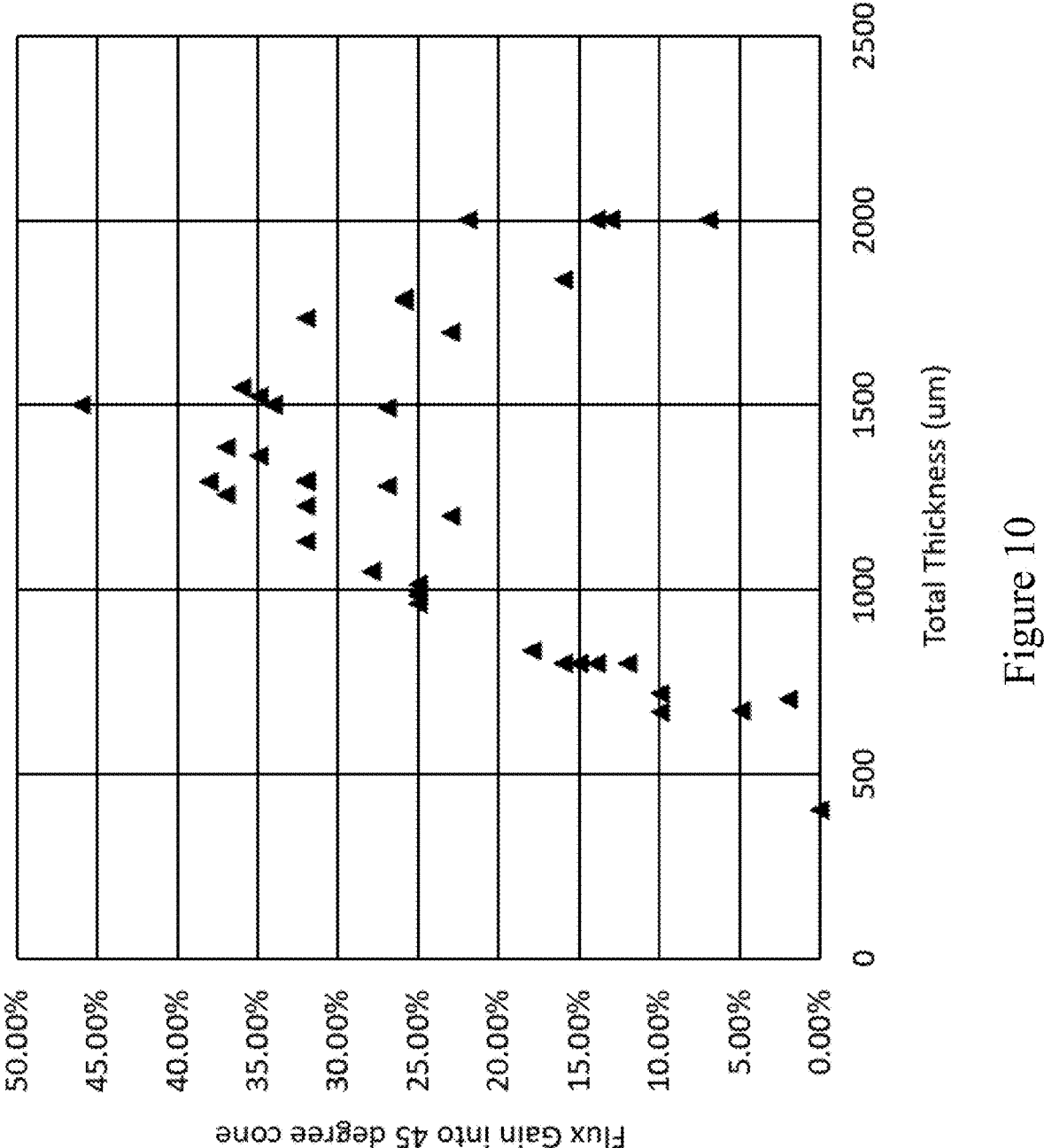
FIG. 10 shows flux gain in a 45 degree cone varying with total thickness of the lens.
Figure 11:
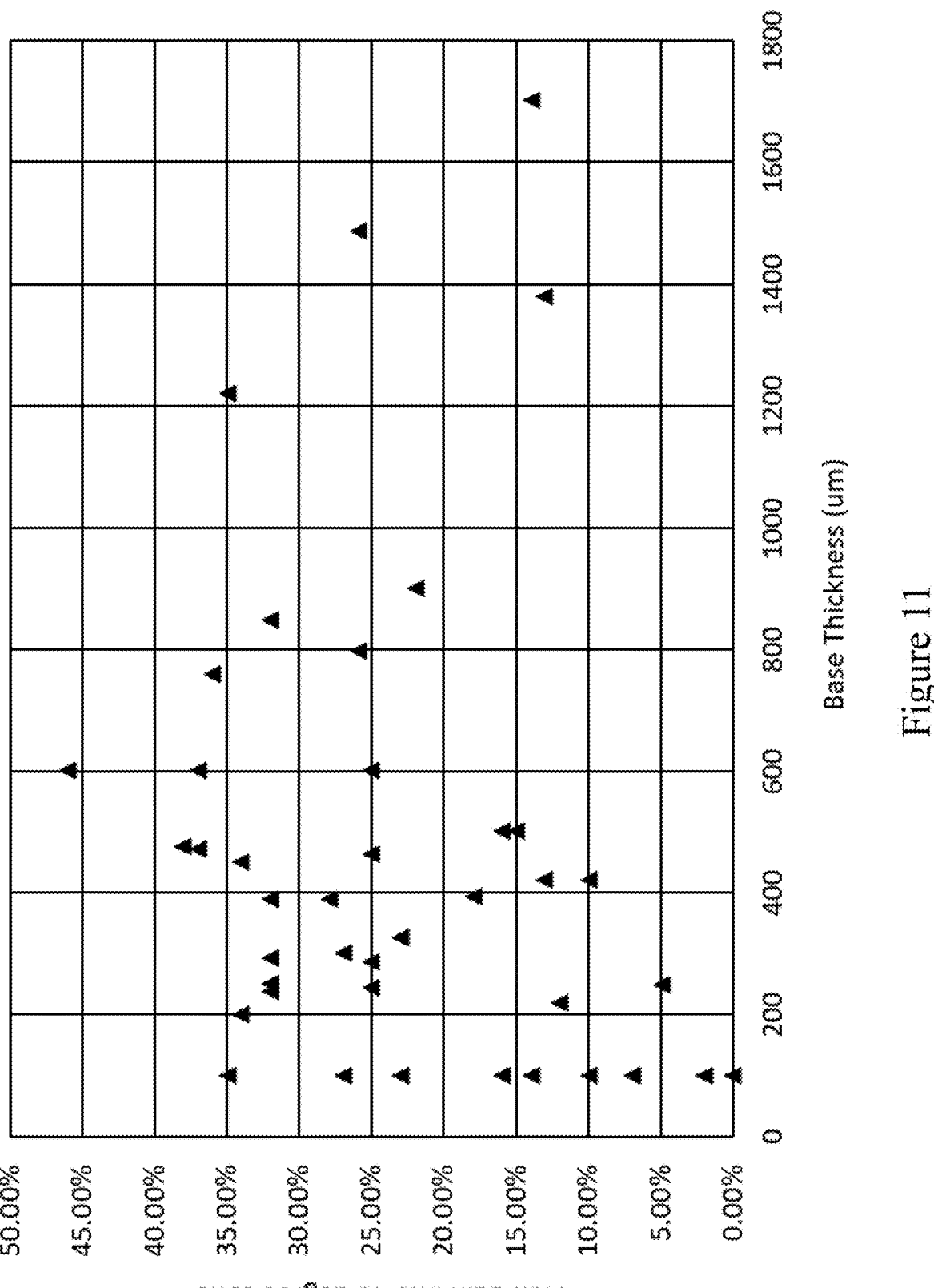
FIG. 11 shows flux gain in a 45 degree cone varying with base thickness of the lens' base.
Figure 12:
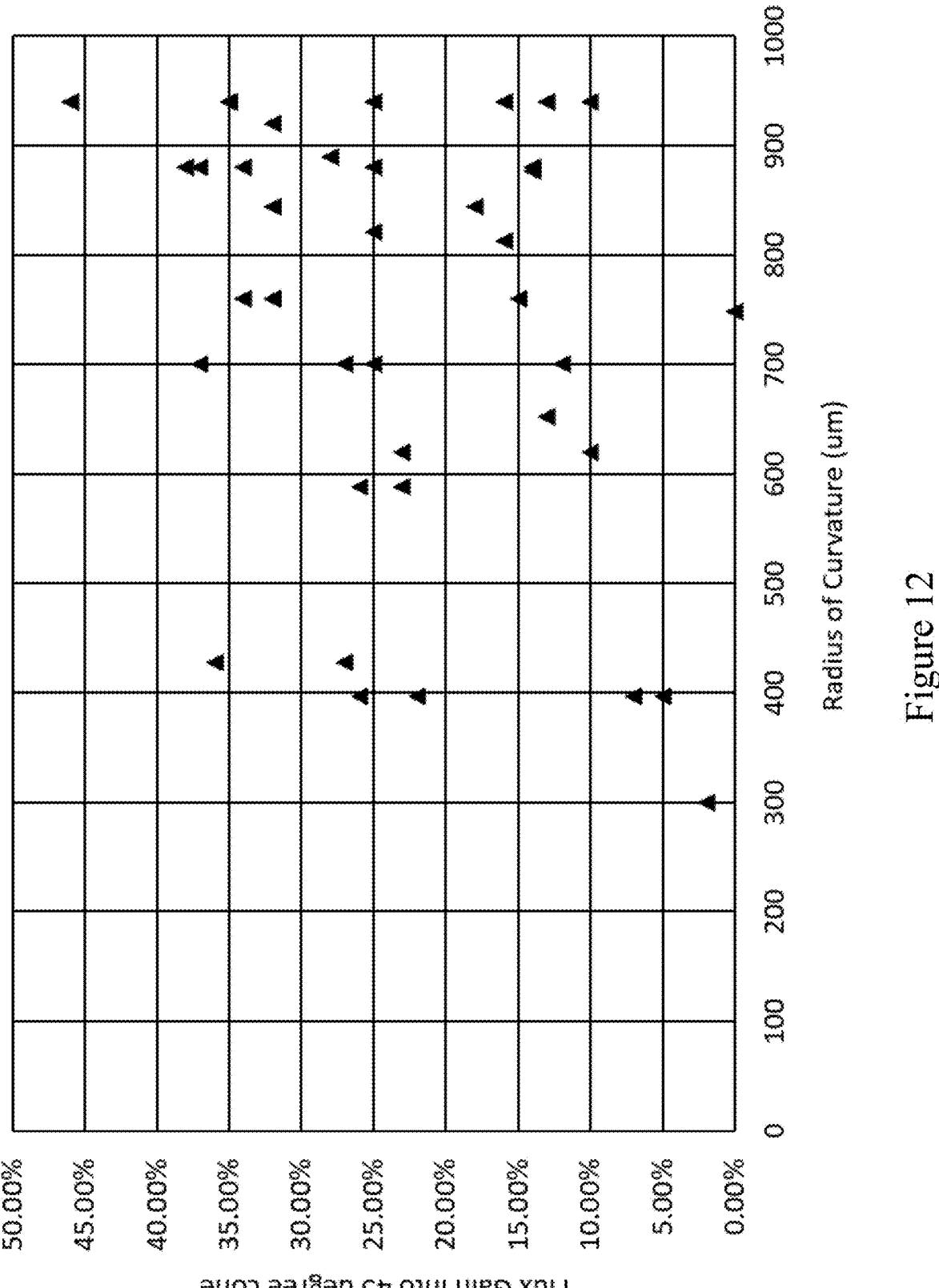
FIG. 12 shows flux gain in a 45 degree cone varying with radius of curvature of a lens' apex.
Figure 13:
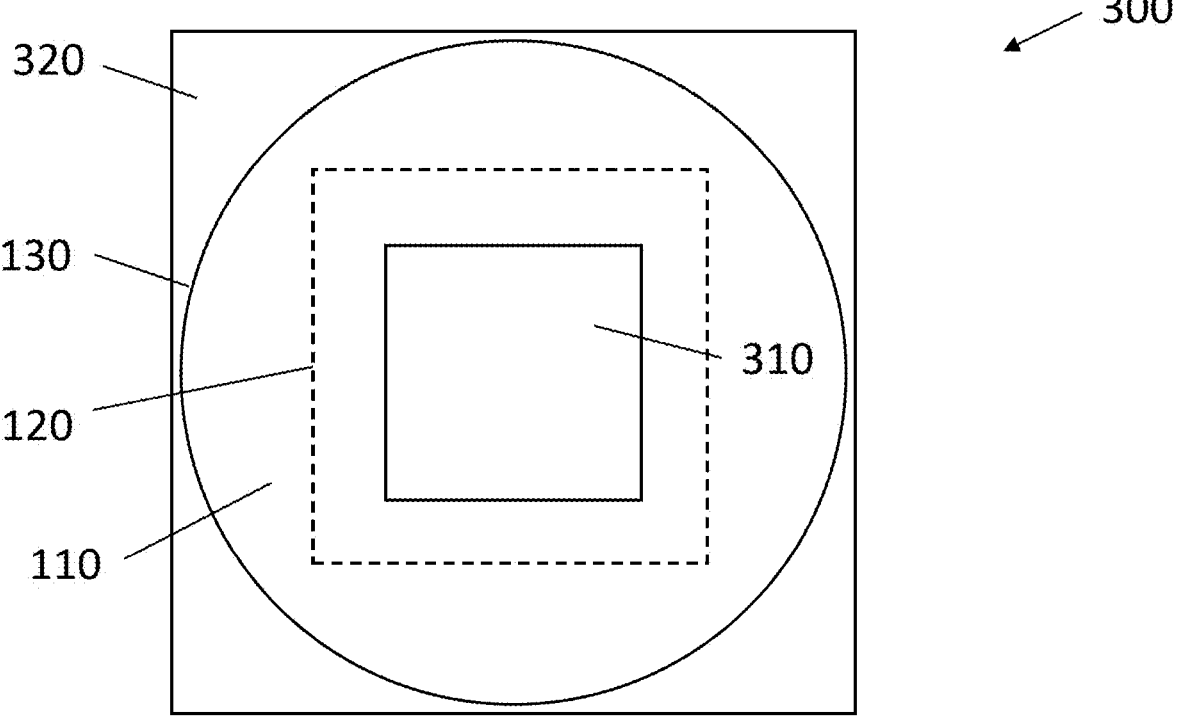
FIG. 13 schematically illustrates a plan view of a lens over an LED on a substrate.
Figure 14:
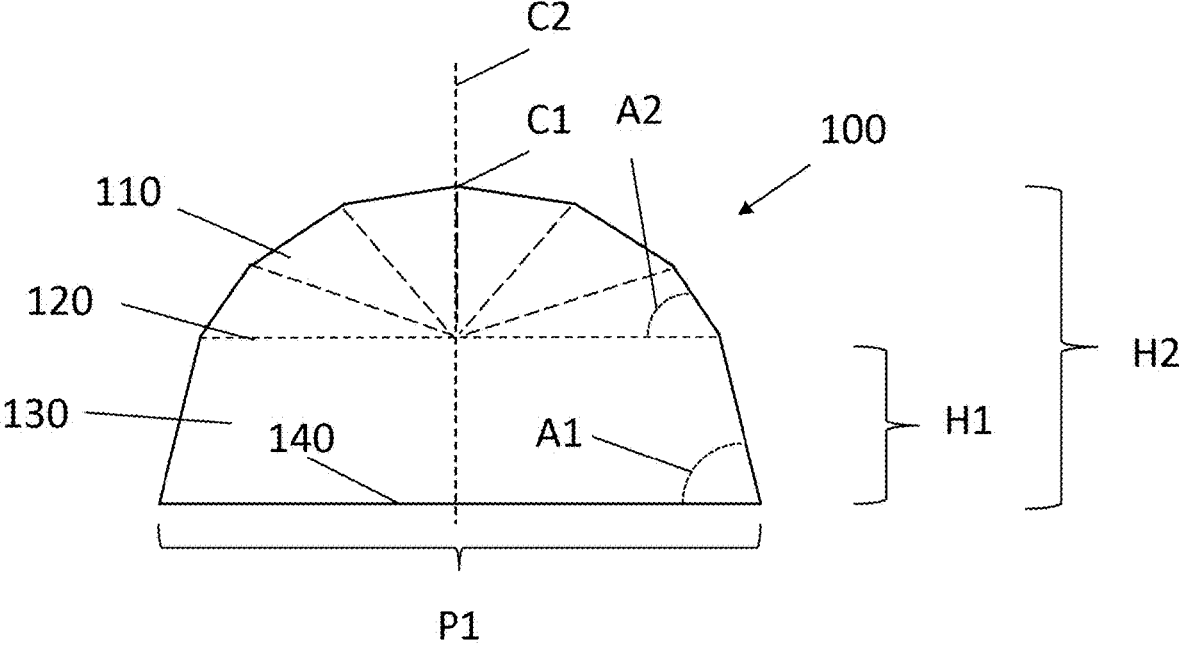
FIG. 14 schematically illustrates a cross-sectional view of a lens with a base and a head and a central axis through the apex.

The lens 100 may adjust the light emitted by the LED 310 to have a narrower cone of emission or more concentrated emission than it would otherwise have. For example, the lens 100 may refract at least some of the light emitted by the LED 310 towards the central axis C2. That is, individual lens 100 are particularly targeted at improving forward directionality, reducing crosstalk between different LEDs within an array of LEDs 310 if an array is so used, and/or increasing the power output of individual LEDs 310 between +65 and −65 degrees compared to if the lens 100 were not used. The lens 310 is designed to reshape the radiation pattern, directing scattered rays from each LED into smaller cone angles (less than 65 degrees). This lens 100 is shaped to replace and improve upon conventional lens known for producing a Lambertian radiation pattern that contributes to heightened crosstalk between LEDs in an array. For example, the lens 100 may redirect light from an LED 310 so that a majority of light (e.g., <50% to 100%, such as 60-90%, such as 70-80%) is emitted within a 65 degree cone, to have a non-Lambertian, top hat shape. For example, the lens 100 may redirect light from an LED 310 so that a majority of light (e.g., <50% to 100%, such as 60-90%, such as 70-80%) is emitted within a 45 degree cone, to have a non-Lambertian, top hat shape. FIG. 6 shows the radiation pattern for these examples, as well as the radiation pattern for a conventional dome.

Figure 5:
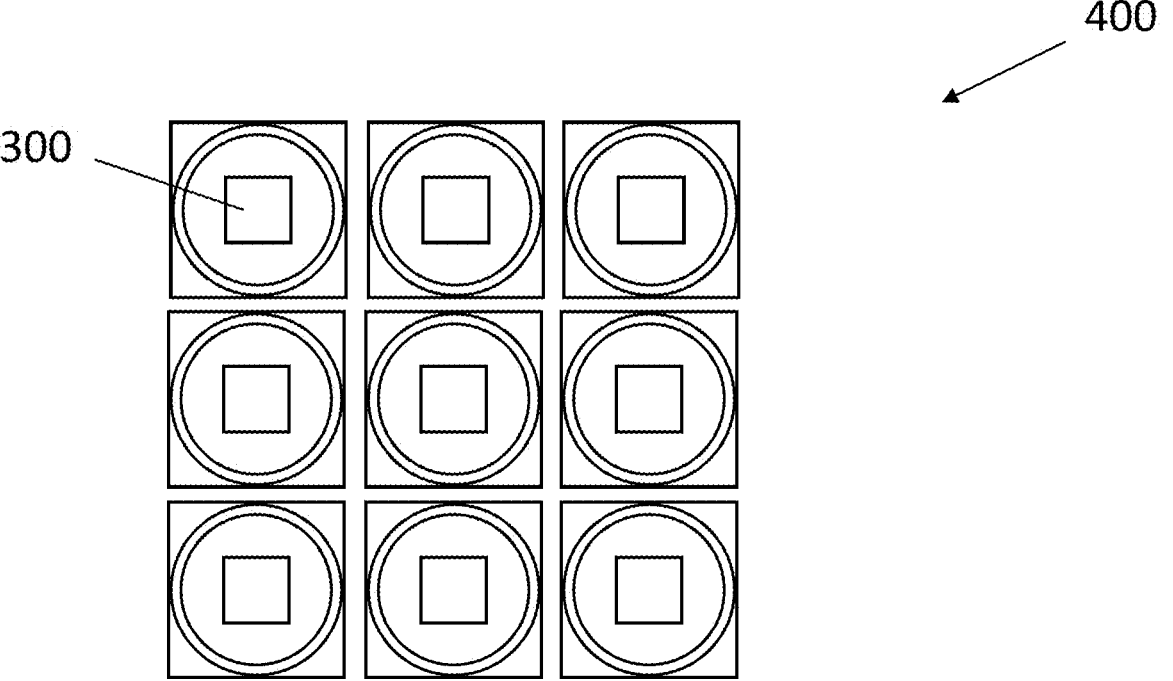
FIG. 5 schematically illustrates plan view of array of LEDs with individual lens disposed over them.

An array of LEDs 310 may be disposed in an X by Y grid with each other, as shown in FIG. 5. Each of the LEDs 310 may be disposed on a same substrate 320 or a different substrate 320. In FIG. 5 each light emitting device 300 has an individual substrate 320 forming a tile. The tile may be 0.5-5 millimeters on a side, such as 2 mm, which may be a similar or a same range as the diameter of the lens 100. The die may be 1-3 mm on a side, such as 1.4 mm. An individual lens 100 may be disposed over each LED 310 and spaced apart from other lens 100 and other LEDs 310 in the array. The array of LEDs 310 may be used for lighting such that the array includes LEDs 310 that emit different colors, such as red, green, and blue. When the LEDs 310 emit different colors from each other they may have different colors from their direct neighbors in the row or column direction. The lens 100 for each LED 310 of one color may differ from the lens 100 for the LED 310 of another color, or they may be the same. The differing characteristics of the lens 100 for different colors may include shape, curvature, total thickness H2, base thickness H1, material, and the like.

This disclosure is illustrative and not limiting. Further modifications will be apparent to one skilled in the art in light of this disclosure and are intended to fall within the scope of the appended claims.

What is claimed is:

1. An optical element comprising:
a base portion comprising a flat surface having an outer perimeter and one or more side walls angled inward toward a central axis of the base portion, the central axis oriented perpendicular to the flat surface, each side wall of the one or more side walls having a perimeter end along the outer perimeter of the flat surface and a distal end that is distal from the flat surface, the perimeter of the flat surface having a diameter of 0.5 mm to 5 mm; and
an upper portion comprising one or more surfaces collectively extending from the distal end of each of the one or more side walls to form an apex centered on the central axis, the upper portion having an effective radius of curvature of 700 microns to 1100 microns at the apex, wherein the distance measured parallel to the central axis from the flat surface to the apex is 1000 microns to 1300 microns, wherein the one or more surfaces of the upper portion comprises two or more surfaces that collectively form polygonal shapes in planes perpendicular to the flat surface and including the central axis.

2. The optical element of claim 1, wherein the distance measured parallel to the central axis from the flat surface of the base portion to the distal end of the base side walls is 100 microns to 700 microns.

3. The optical element of claim 1, wherein the distance measured parallel to the central axis from the flat surface to the apex is 900 microns to 1300 microns.

4. The optical element of claim 1, wherein the upper portion is integral with the base portion.

5. The optical element of claim 1, wherein:
the outer perimeter of the flat surface is circular or elliptical;
the base portion comprises only a single continuous side wall extending along the outer perimeter of the flat surface and angled toward the central axis; and
the single continuous side wall has circular or elliptical cross-sectional shapes in at least some planes parallel to the flat surface corresponding to the circular or elliptical shape of the outer perimeter.

6. The optical element of claim 5, wherein the single continuous side wall has polygonal shapes in planes perpendicular to the flat surface and including the central axis.

7. The optical element of claim 5, wherein the upper portion has a lower end extending from the distal end of the base portion, the lower end forming an inner perimeter of the optical element that is circular or elliptical.

8. The optical element of claim 1, wherein the base portion comprises a same material as the upper portion.

9. The optical element of claim 1, wherein the base portion comprises a different material as the upper portion.

10. The optical element of claim 1, wherein:
the base portion is integral with the upper portion,
the base portion and the upper portion comprise silicone, and
the base portion comprises a hollow at the flat surface through which the central axis extends.

11. A light emitting device, comprising:
a substrate;
an LED disposed on the substrate; and
the optical element of claim 1 disposed on the substrate and the LED.

12. The light emitting device of claim 11, wherein the optical element is disposed in direct contact with the substrate and the LED.

13. The light emitting device of claim 11, wherein the LED comprises InGaN and is configured to emit blue light.

14. A light emitting array, comprising:
a plurality of substrates;
a plurality of LEDs disposed on the substrate; and
a plurality of optical elements, each of the optical elements comprising the optical element of claim 1 disposed on a respective one of the substrates and on a respective one of the LEDs.

15. An optical element comprising:
a base portion comprising a flat surface having an outer perimeter and a single continuous side wall extending along the outer perimeter of the flat surface and angled toward a central axis of the base portion, the central axis oriented perpendicular to the flat surface, the single continuous side wall having a perimeter end along the outer perimeter of the flat surface and a distal end that is distal from the flat surface, the single continuous side wall having circular or elliptical cross-sectional shapes in at least some planes parallel to the flat surface corresponding to the circular or elliptical shape of the outer perimeter, the perimeter of the flat surface having a diameter of 0.5 mm to 5 mm, the outer perimeter of the flat surface being circular or elliptical; and an upper portion comprising one or more surfaces collectively extending from the distal end of the single continuous side wall to form an apex centered on the central axis, the upper portion having an effective radius of curvature of 700 microns to 1100 microns at the apex;

wherein the distance measured parallel to the central axis from the flat surface to the apex is 1000 microns to 1300 microns, and wherein the upper portion has a lower end extending from the distal end of the base portion, the lower end forming an inner perimeter of the optical element that is polygonal.

16. The optical element of claim 15, wherein the one or more surfaces of the upper portion comprises two or more surfaces that collectively form polygonal shapes in planes perpendicular to the flat surface and including the central axis.

17. An optical element comprising:

a base portion comprising a flat surface having an outer perimeter and one or more side walls angled inward toward a central axis of the base portion, the central axis oriented perpendicular to the flat surface, each side wall of the one or more side walls having a perimeter end along the outer perimeter of the flat surface and a distal end that is distal from the flat surface, the perimeter of the flat surface having a diameter of 0.5 mm to 5 mm; and an upper portion comprising one or more surfaces collectively extending from the distal end of each of the one or more side walls to form an apex centered on the central axis, the upper portion having an effective radius of curvature of 700 microns to 1100 microns at the apex;

wherein the distance measured parallel to the central axis from the flat surface to the apex is 1000 microns to 1300 microns; and wherein the one or more surfaces of the upper portion includes two or more surfaces that are each a polygon.

* * * * *